United States Patent Office

3,522,049
Patented July 28, 1970

3,522,049

PHOTOHARDENING

Albert Lucien Poot, Wilrijk-Antwerp, and Jan van den Bogaert, Schilde, Belgium, assignors to Gevaert-Agfa N.V., Mortsel, Belgium, a Belgian company

No Drawing. Filed Dec. 17, 1965, Ser. No. 514,659
Claims priority, application Great Britain, Mar. 3, 1965, 9,136/65
Int. Cl. G03c *1/52*
U.S. Cl. 96—91 13 Claims

ABSTRACT OF THE DISCLOSURE

A recording material is disclosed which comprises a light activated catalyst and a polymer. This catalyst composition or compound produces hydrogen ions upon exposure to actinic light. The ions come into contact with the polymer in the exposed areas and decrease its solubility in these areas. The recording material is useful in making photo-resists and the like.

The present invention relates to a process for photochemically decreasing the solubility of polymers, and the use of said process for recording and reproducing information. More particularly the present invention relates to the reproduction of line originals and to the production of photo-resists and printing plates.

For preparing a photo-resist or printing plate a supporting member can be used which is coated with a photo-sensitive layer that has the property of becoming more insoluble where it is exposed to actinic radiation. Such a layer can be treated after image-wise exposure with a solvent to remove the more soluble parts thus leaving an image-wise pattern of polymer on the support. This image can then act as a printing plate or as a resist shielding the support surface against chemical attack. It can provide a mask for electroplating of metals, or the deposition of ink or toner. Moreover the resist image can itself be coloured to act as a decorative design.

When grease-accepting, the image-wise polymer pattern can be used for producing lithographic prints. In the case the photosensitive layer is applied to a screening material a master for screen-printing can be produced.

The known photo-polymerization or photo-insolubilization systems can be divided into three classes. In the first class can be grouped the non-light-sensitive colloids or synthetic polymers that can be cross-linked by the decomposition products of a photo-sensitive compound that decomposes on exposure to form an active species that insolubilizes the surrounding polymer, e.g. dichromate in gelatin. The second class relates to polymers that have light-sensitive groups built into their structures so that by irradiation cross links are formed between polymer molecules to greatly lower their solubility, e.g. polyvinyl cinnamate. In the third class simple monomeric substances can be classified which by exposure are caused to link with each other to give a large molecular structure. If, for example, a solution of the monomer acrylamide is exposed to short wavelength radiation a gel is formed that consists of polyacrylamide.

A problem which limits intensive exploitation of the latter system is that many of the monomers are liquid substances and therefore the unexposed layers are inconvenient to handle.

The process of the present invention can be characterized as a photochemical insolubilization or hardening process, wherein a photolytic compound or composition is used which by exposure to electro-magnetic radiation energy produces an acid, which catalyses the insolubilization of a polymeric substance which acid can be formed in situ in contact with the polymeric substance or allowed to come into contact with said substance after the exposure.

Thus, it is an object of the present invention to provide a recording material, wherein a photolytic compound can be image-wise exposed to actinic electromagnetic radiation whereby image-wise in contact with surrounding polymeric material an acid is produced or image-wise an acid is produced which is allowed to come into contact with polymeric material to image-wise catalyze the insolubilization of the latter.

The unexposed areas can be removed by a solvent treatment or a stratum of the recording layer corresponding with said areas can be transferred to a transfer sheet e.g. a paper sheet by pressing the exposed layer, if necessary pretreated with a swelling agent, against said transfer sheet and thereafter peeling it apart therefrom.

By incorporating a dyestuff in the recording layer already during the manufacture of the latter, the obtained relief images are coloured. It is also possible to dye the relief image after its preparation by allowing a dissolved dye to diffuse therein. The recording layer or transfer sheet containing the relief image may also be used as a printing master or can be used as a resist to produce same, e.g. by etching. When the recording layer is applied to a screening material suited for use in the preparation of screen printing masters, the recording layer can be image-wise washed away leaving a screen printing resist.

Several compounds or chemical compositions, which on exposure to actinic electromagnetic radiation, generate an acid substance, are already known. As an illustration thereof reference is made to a photo-sensitive composition containing as a photo-sensitive acid precursor carbon tetrabromide, a hydrogen donor such as triphenyl methane and a sensitizer such as diphenyl amine. Light absorbed by an intimate mixture of said substances forms catalytic quantities of acid (ref. Photographic Science and Engineering, vol. 8, No. 1, 1964, p. 35). Further reference is made to compounds based on the orthoquinone diazide or diazo-oxide structure. On exposure to light, the nitrogen is liberated and a carboxylic acid is formed. Examples of such reactions are the following:

(a)

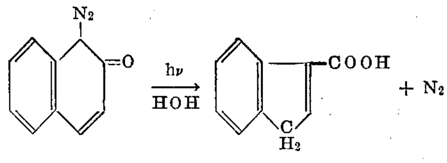

(b)

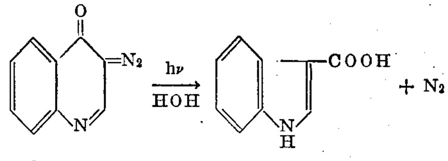

(c)

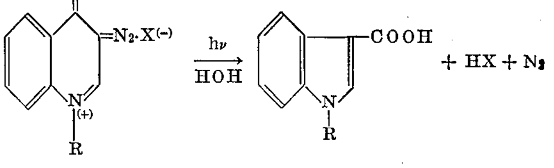

wherein:

R is an alkyl radical, and
$X^{(-)}$ is an acid radical.

The preparation of naphthoquinone-(1,2)-1-diazo compounds is described in German patent specification 172,-446. The preparation of 4-(3H)-quinolone-3-diazo compounds is described in Ann. 583, 150–160 and in U.S. patent specification 2,859,112.

Diazoquinones of quinoline and their derivatives that are quaternised on the nitrogen atom have proven to be especially suitable. Compounds of the following general formula are preferred:

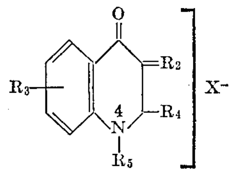

wherein:

$R_3$ represents an alkyl group, preferably a lower alkyl group of at most 3 carbon atoms, an aryl group, such as phenyl, a halogen atom, such as chlorine and bromine, an amino group, an alkyl-substituted amino group, a hydroxy group, an alkoxy group of at most 5 carbon atoms, a carbonamide group, or a hydrogen atom, $R_4$ represents a hydrogen atom or a lower alkyl group, preferably methyl, $R_5$ represents a lower alkyl group of preferably at most 4 carbon atoms, and $X^-$ represents any anion e.g. a bromide or a chloride ion, a sulphate ion or preferably an anion of aromatic sulphonic acids e.g. the anion of p-toluene sulphonic acid.

The preparation of these compounds is carried out by quaternization of the diazoquinones of quinoline, described in the literature, by means of an organic alkylating agent, such as e.g. alkyl halides, alkyl sulphate or alkyl esters of aromatic sulphonic acids.

The following is the preparation of a compound with both of $R_1$ and $R_2$ being hydrogen, $R_3$ being methyl and $X^-$ being $CH_3—C_6H_4—SO_3^{(-)}$.

17 g. of 3-diazoquinoline-4-one (O. Süss et al., Ann. 583 (1953) 150) are heated for 15 min. at 75° C. in 40 ccs. of benzene together with 40 g. of the methyl ester of p-toluene sulphonic acid whilst stirring. The compound dissolves and the quaternary salt separates. The mixture is stirred for another 30 min. whereupon the quaternary salt is sucked off and recrystallized from ethanol. Colourless needles are obtained with melting point: 173–174° C. (with decomposition). Yield: 15.6 g.

For another type of photolytic acid producing compounds reference is also made to the cyclohexadienone compounds described in United Kingdom patent specification 900,586 and U.S. patent application 463,029.

The compound according to reaction scheme *c* offers the possibility to reduce the pH at the exposed areas considerably namely in the case $X^-$ is the anion of a strong acid. A compound also interesting in this respect is 3,3,4,4,4-pentachloro-1-diazo-2-butanone which on exposure would be decomposed according to the following reaction scheme:

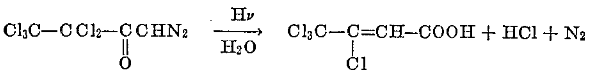

3,3,4,4,4-pentachloro-1-diazo-2-butanone is prepared according to Jl. Am. Chem. Soc. 63 (1941) 1438.

The amount of photolytically acid producing compound in the recording layer or in a layer in working contact therewith may vary within wide limits, preferably in respect of the total content of curable polymer 0.1 to 5% by weight is used.

The polymers of the recording layer that are to be insolubilized may be classified according to their solubility properties into hydrophilic polymers and polymers that are water-insoluble but soluble in organic solvents.

The water-resistant polymers are normally also resistant to etching solutions containing e.g. acid or alkali; therefore they are preferably used in the preparation of printing masters by an etching technique e.g. intaglio printing masters and in the preparation of etched printed circuits.

The invention more especially relates to a photochemical insolubilization system wherein use is made of materials that are curable under the influence of an acid by cross-linking. The cross-linking agent may be a monomer or precondensate. As illustration of a suitable system may be mentioned e.g. a polymer composition consisting of polymers or containing polymers containing hydroxyl groups, thiol groups, amide groups or other groups with active hydrogen atoms wherein the hardening e.g. with an aldehyde for example formaldehyde and/or a methylolamide compound e.g. bis(hydroxymethyl)-ureum is catalyzed by an acid.

Known resins that are curable with an aldehyde e.g. formaldehyde and furfural under the influence of an acid are e.g. described in "Lackkunstharze" of Hans Wagner and Hans Friedrich Sarx (Carl Hanser Verlag, Munich 1959). Commonly used polycondensation resins of this type are the phenol formaldehyde resins and the amide and amine formaldehyde resins.

Preferably applied water-resistant polycondensation products that are soluble in suitable organic solvents and curable under the influence of an acid according to the present invention are polycondensation products comprising amine and/or amide groups, and/or urethane groups, and/or urea groups, that are reactive with respect to formaldehyde, such as the polycondensates comprising in their structure amide groups as well as urethane groups and urea groups. Examples of such polycondensates are the polyester amides modified with organic di-isocyanates described in British patent specification 585,205 and U.S. patent specifications 2,422,271 and 2,424,883. Polyester and polyester amides both modified with organic di-isocyanates which are described i.a. in U.S. patent specification 2,424,883 and U.S. patent application 377,508 (now Pat. 3,366,505) are elastomers which can easily be cross-linked with formaldehyde under the influence of an acid catalyst.

Urea formaldehyde resins and melamine formaldehyde resins, both curable under the influence of an acid, are described in "Grundlagen der Anstrichwissenschaft" of A. V. Blom, p. 141–143. The presence of small amounts of acid will accelerate the cure especially in the case of butylated products, but unlike urea formaldehyde resins satisfactory cure of melamine formaldehyde resins is not possible at room temperature even in the presence of an acid catalyst (ref. Amino Resins by J. F. Blais, Reinhold Publishing Corporation, New York (1959), p. 20).

Resols which are curable in cold state with an aldehyde under the influence of an acid are more particularly described i.a. in the above-mentioned book of Wagner and Sarx on pages 48–49.

Appropriate aldehydes for the curing or insolubilization reaction, catalyzed with acid, are formaldehyde, soluble curing phenol formaldehyde resins, urea formaldehyde resins or melamine formaldehyde resins, compounds splitting off formaldehyde such as hexabismethoxymethyl melamine. More particulars on this manner can be found in U.S. patent specification 2,424,883.

One has to take care that the recording layer remains neutral or slightly alkaline in non-exposed state.

If water is produced in the acid-catalyzed condensation reaction, it is interesting to apply the recording layer water-free from organic solvents, and to use the water formed in the condensation reaction to react with a neutral organic substance liberating acid in situ. Such a system can be practized by using in the recording layer dimethyl oxalate; an amount of 0.25–1% by weight is recommended. It is self-explanatory that the use of a substance liberating acid in situ by the action of water produced by the condensation reaction, accelerates the hardening reaction considerably.

The recording layer may further contain plasticizers, fillers and metal particles as well as pigments and soluble dyes or components for dye formation.

From the foregoing and the examples it will be clear that the invention is not only applicable in the preparation of relief images but can be applied for producing records in terms of a permeable/impermeable and/or hydrophilic/hydrophobic differentiation as between the exposed and non-exposed areas of the recording layer (e.g. envolving selective absorption of a dye or dye component). Methods according to which such differentiation can be used are e.g. described in U.S. patent application Ser. No. 421,861 which is a continuation-in-part application of Ser. No. 337,664, now abandoned.

According to a special embodiment of recording of the present invention it is possible to use a recording material wherein the acid producing compound and the curable polymer are applied in separate layers. This composition has the advantage of being more stable under storage conditions, more particularly in the case both layers are separated by an interlayer which, however, may not prevent the diffusion of the acid e.g. when a solvent and/or heat are applied to the recording layer after the exposure.

According to another special embodiment of the present invention the acid producing compound and the curable polymer can be applied in separate materials. The material containing the acid producing compound is contacted during and/or after image-wise exposure with the curable layer of the other material for enabling transfer of the acid compound to the curable layer. In order to accelerate the diffusion of the acid and the hardening it may be advantageous to apply, before contacting the layer containing the acid with the curable layer, a solvent to the contacting side of at least one of said layers and to apply heat to at least one of said layers before or during the contacting.

The thickness of the curable layer is directly proportional to the thickness desired in the relief image (if such is to be produced) and this will depend on the subject being reproduced and particularly on the use of the relief image e.g. the use as a particular printing master, e.g. planographic, intaglio or letter-press printing master. In general the thickness of the curable layer will vary from about 0.001 mm. to about 7 mm. Layers ranging from about 0.001 mm. to about 0.70 mm. thickness will be used for half-tone plates (screen images). Layers ranging from about 0.25 to 1.50 mm. thickness will be used for the majority of letter-press printing plates, including those wherein half-tone and line images are to be combined.

If the surface of a curable film or layer is somewhat sticky which is e.g. the case in the viscous liquid recording layer compositions mentioned hereinafter, the exposed film or layer can e.g. be developed by means of a powder. The powder taken up by the unhardened areas can be a solvent soluble dye so that the obtained master can be used in hectographic printing for transfer to a transfer sheet. Fixation of the powder image can be carried out by heating or by a solvent treatment as known in xerography.

As an illustration of curable liquid compositions which can be photohardened according to the present invention we may refer to the following:

Liquid condensation products of phenol and formaldehyde, that are prepared ordinarily in the presence of alkali, wherein under the influence of hydrochloric acid solidification can be produced (see United Kingdom specifications 27,096 (1908) and 6430 (1911) resp. J.S.C.I. 1909, 28, 843).

A liquid product prepared according to the United Kingdom patent specification 129,993 (1919) see also Chem. Abstr. 1919, 13, 2984 by reaction of phenol, cresol or naphthol with anhydrous polymers of formaldehyde (paraformaldehyde trioxymethylene) in the presence of traces of alkaline catalysts and which liquid product can be converted into an insoluble infusible product by the addition of organic acids (lactic acid, acetic acid, formic acid, oxalic acid, tartaric acid, citric acid, gallic acid, tannic acid), or small amounts of mineral acids such as hydrochloric acid, or sulphuric acid, phosphoric acid and boric acid. The conversion takes place in the cold, but more rapidly on heating.

Further the attention is drawn to U.S. patent specification 1,794,084 and German patent specification 511,979 from which uncured condensation products are known which can be hardened with a gaseous or volatile acid e.g. sulphur dioxide, formic acid, hydrofluoric acid and hydrochloric acid. For effecting a more rapid hardening after exposure heat is supplied to the condensation product.

The base or support material for the curable layer can be of any natural or synthetic product capable of being worked up in film or sheet form. It can be flexible or rigid, reflective or non-reflective of actinic light. For the manufacture of printing masters metals are normally preferred as the base materials. However, e.g. where weight is critical, synthetic resin or polymer sheets are desirable base materials. Rotary press plates can be prepared by using cylindrically-shaped base plates carrying the curable composition and exposing them directly through a concentrically disposed image bearing transparency. If the base material has to be made non-reflective an anti-halation layer can be first applied thereon. The layer absorptive of reflected light, can be made by dispersing a finely divided dye or pigment which substantially absorbs actinic light in a solution or aqueous dispersion of a resin or polymer which is adherent to both the support and the curable layer and coating it on the support to form an anchor layer which is dried. Suitable antihalation pigments include carbon black, manganese dioxide and dyes such as Acid Blue Black (C.I. 246).

The curable element used in the present invention can be made by casting or extruding the curable composition on a support as a solution or dispersion, or if desired (when it is a liquid) without solvent.

The composition if sufficiently film-forming can also be cast or extruded on a casting wheel or belt in the form of a self-supporting sheet. That sheet can be later on affixed to the surface of a permanent support if necessary.

Actinic light from any source and of any type can be used for the photolytic production of the acid. The light may emanate from point sources or be in the form of parallel rays or divergent beams. It is preferred to use a broad light source close to the image-bearing transparency which has to be recorded. Actinic light sources which can be used are e.g. carbon arcs, mercury vapor arcs, and fluorescent lamps with special ultra-violet light emitting phosphors. Of these, the mercury-vapor arcs are most suitable.

The literature hereinbefore referred to including the published patent specifications and the specifications of copending patent applications, should be read in conjunction with the present specification.

The following examples illustrate the present invention without, however, limiting it thereto.

EXAMPLE 1

8 ccs. of a solution A comprising the following ingredients:

3 g. of partially hydrolyzed copoly(vinyl chloride/vinyl acetate) containing 2.3% by weight of free hydroxyl groups and 3% by weight of vinyl acetate groups, 0.5 g. of hexa-bis(methoxymethyl) melamine, and 7 ccs. of a 27% solution in 1,2-dichloroethane of a polyester amide modified with polyisocyanate resulting from the reaction of 5 parts of hexamethylene di-isocyanate with 100 parts of a polyester amide prepared by condensing 7.5 moles of a polyethylene glycol, 9 moles of adipic acid, and 1.5 mole of ethanol amine, are mixed with 2 ccs. of a solution B which is a 5% solution in methanol of 3,3,4,4,4-pentachloro-1-diazo-2-butanone. The mixture obtained is coated on an aluminium plate in such a way that after drying a layer of 0.1 mm. thickness is obtained. The light-sensitive layer formed is exposed for 10 min. through a line original with a high pressure ultra violet lamp of 80 watt placed at a distance of 15 cm.

The exposed layer is treated with 1,2-dichloroethane whereby the unexposed areas are dissolved. The remaining image-wise pattern of insolubilized polymer is dyed with a solution of Crystal Violet in 1,2-dichloroethane. The plate thus obtained can be used as offset printing master. The uncovered aluminum parts are hydrophilized by means of the following solution:

carboxymethylcellulose—3.24 g.
sodium phosphate—0.6 g.
phosphoric acid—0.3 g.
cetyltrimethylammonium bromide—0.06 g.
20% aqueous formaldehyde—1 cc.
water to 100 ccs.

To improve the mechanical strength of the remaining polymer parts they are treated with a lithographic lacquer as described in the Canadian patent specification 686,284, filed June 2, 1961 by Gevaert Photo-Production N.V.

EXAMPLE 2

Example 1 is repeated but the 5% solution in methanol of 3,3,4,4,4-pentachloro-1-diazo-2-butanone is replaced by a 5% solution in methanol of 1-methyl-3-diazoquinolinium-4-one tolusulphonate. With the obtained offset plate very sharp prints are produced:

EXAMPLE 3

The following liquid composition is coated on a triacetate support that is coated with a gelatin subbing layer:

5% solution in methanol-water (9:1) of copolyamide of hexamethylene diamine, 4,4′ - diaminodicyclohexylmethane, caprolactam and adipic acid manufactured under the name ULTRAMID IC by Badische Anilin & Soda-Fabrik, Ludwigshafen, Germany—5 ccs.
5% solution of bis(hydroxymethyl)-urea in water-methyl glycol (1:1)—3 ccs.
1% solution in water of 1-methyl-3-diazoquinolinium-4-one tolusulphonate—1 cc.
pyridine—1 cc.
Crystal Violet—0.01 g.

The thickness of the dried layer is 50$\mu$. The said layer is exposed through a negative transparency for 15 min. with a high pressure ultra violet lamp of 125 watt placed at a distance of 25 cm.

The unexposed parts of the recording layer are removed by washing the layer with a 5% calcium chloride solution in methanol, or with methanol containing 10% of water.

EXAMPLE 4

The following liquid composition is coated on a baryta coated paper support:

10% solution in water/ethanol (9:1) of polyvinyl alcohol (containing 38% of acetate units)—3 ccs.
10% solution in water of bis(hydroxymethyl)-urea—2 ccs.
1% solution in water of 1-methyl-3-diazoquinolinium-4-one tolusulphonate—1 cc.
carbon black—0.01 g.
water—4 ccs.

The thickness of the dried layer amounts to 60$\mu$.

The dried layer is exposed as described in Example 3. The unexposed parts are washed away with cold water.

EXAMPLE 5

Example 1 is repeated; the recording layer, however, is coated on an insulating support provided with a thin copper layer which after the removal of the non-exposed polymer parts is image-wise etched away with a 10% aqueous iron (III) chloride solution. The original in this case is a negative transparency of a printed circuit.

EXAMPLE 6

A stencil master is prepared as follows:

A Japan paper weighing 14 g. per sq. m. is soaked with a solution consisting of:

| | Ccs. |
|---|---|
| 10% solution in water/ethanol (9:1) of polyvinyl alcohol (containing 38% of acetate units) | 300 |
| 10% solution in water of bis(hydroxymethyl)-ureum | 200 |
| 1% solution in water of 1-methyl-3-diazo-quinolinium-4-one tolusulphonate | 100 |
| water | 400 |

Upon drying this Japan paper is found to contain 9 g. of solid substance per sq. m. The paper thus treated is exposed to U.V. light through a positive transparency for 15 min. by means of a high pressure mercury vapor bulb placed at a distance of 25 cm. After exposure the unexposed parts are washed away with cold water. After drying a positive stencil master suited for printing with a fatty ink is obtained.

What we claim is:

1. A photosensitive composition comprising in association:

(1) a polymeric material which upon reaction with an aldehyde cross-linking agent in a hydrogen ion catalyzed reaction becomes less soluble in a solvent, (2) a photosensitive compound which when exposed to actinic light will produce a compound that by reaction with water forms hydrogen ions, derived from a carboxylic acid group, and (3) an aldehyde or aldehyde producing compound in which the aldehyde is capable of cross-linking the polymeric material.

2. The photosensitive composition of claim 1, wherein the cross-linking agent is monomeric.

3. The photosensitive composition of claim 1, wherein the cross-linking agent is a precondensate.

4. The photosensitive composition of claim 1, wherein the cross-linking agent is formaldehyde or a methylolamide compound.

5. The photosensitive composition of claim 1, wherein the polymeric material is a polycondensation product containing active hydrogen atoms in a group selected from amino, amido, urethane and hydroxyl.

6. The photosensitive composition of claim 1 wherein said cross-linking agent is selected from the group consisting of an aldehyde and a compound capable of splitting off an aldehyde and the polymeric material is a formaldehyde resin derived from a compound selected from the group consisting of a phenol, urea and melamine.

7. The composition of claim 5 wherein the polymer is a polyvinyl alcohol.

8. The composition of claim 5 wherein the polymer is a polyester amide which is modified with a polyisocyanate.

9. A photosensitive recording element which comprises a support base having coated thereon a photosensitive composition as defined in claim 1.

10. The photosensitive composition of claim 1, wherein the photosensitive compound is an orthoquinone diazide.

11. The photosensitive composition of claim 1, wherein the photosensitive compound is a quaternized orthoquinone diazide.

12. The photosensitive composition of claim 11 wherein the quaternized orthoquinone diazide has the following general formula:

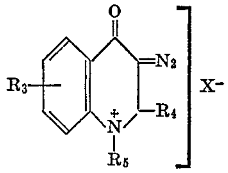

wherein:

- $R_3$ is selected from the group consisting of a lower alkyl group of 1–3 carbon atoms, an aryl group, a halogen atom, an amino group, an alkyl-substituted amino group, a hydroxy group, an alkoxy group having 1–5 carbon atoms, a carbonamide group, and a hydrogen atom,
- $R_4$ is selected from the group consisting of a hydrogen atom and a lower alkyl group,
- $R_5$ represents a lower alkyl group, and
- $X^-$ is an anion selected from the group consisting of bromide, chloride, sulphate, and aromatic sulphonate ion.

13. The photosensitive composition of claim 11 wherein the quaternized orthoquinone diazide is a quaternized 4-(3H)-quinolone-3-diazo compound.

References Cited

UNITED STATES PATENTS

| | | | |
|---|---|---|---|
| 1,587,272 | 6/1926 | Beebe et al. | 96—115 |
| 2,859,112 | 11/1958 | Sus et al. | 96—33 X |
| 3,074,869 | 1/1963 | Workman | 204—159.15 |
| 3,119,825 | 1/1964 | Tetenbaum et al. | 96—111 X |
| 3,159,603 | 12/1964 | Sporer et al. | 96—115 X |
| 3,205,157 | 9/1965 | Licari et al. | 96—115 X |
| 3,231,377 | 1/1966 | Dickinson et al. | 96—33 |
| 3,231,382 | 1/1966 | Silver | 96—115 X |
| 3,268,333 | 9/1966 | Allman et al. | 96—115 X |

OTHER REFERENCES

Blais: "Amino Resins," 1959, Reinhold Series, pp. 16 and 20.

Martin: "The Chemistry of Phenolic Resins," 1956, pp. 87–88.

DONALD LEVY, Primary Examiner

R. E. MARTIN, Assistant Examiner

U.S. Cl. X.R.

96—115